US005900690A

United States Patent [19]

Gipson et al.

[11] Patent Number: 5,900,690

[45] Date of Patent: * May 4, 1999

[54] APPARATUS AND METHOD FOR CONTROLLING AN ULTRASONIC TRANSDUCER

[76] Inventors: Lamar Heath Gipson, 2357 Nowlin Cir., Acworth, Ga. 30102; Bernard Cohen, 381 Lakeshore Dr., Berkeley Lake, Ga. 30136; Lee Kirby Jameson, 115 Olive St., Roswell, Ga. 30075

[ * ] Notice: This patent issued on a continued prosecution application filed under 37 CFR 1.53(d), and is subject to the twenty year patent term provisions of 35 U.S.C. 154(a)(2).

[21] Appl. No.: 08/671,266

[22] Filed: Jun. 26, 1996

[51] Int. Cl.[6] .......................... H03K 3/023; H01L 41/09

[52] U.S. Cl. .......................................... 310/316

[58] Field of Search .................................. 310/316

[56] References Cited

U.S. PATENT DOCUMENTS

| | | | |
|---|---|---|---|
| 4,562,413 | 12/1985 | Mishiro et al. | 310/316 |
| 4,562,840 | 1/1986 | Batina et al. | 128/419 PT |
| 4,700,707 | 10/1987 | Batina et al. | 128/419 PT |
| 4,721,874 | 1/1988 | Emmert | 310/316 |
| 4,741,340 | 5/1988 | Batina et al. | 128/419 PT |
| 4,849,872 | 7/1989 | Gassler | 363/49 |
| 4,853,579 | 8/1989 | Kawasaki et al. | 310/316 |
| 4,868,445 | 9/1989 | Wand | 310/316 |
| 4,879,528 | 11/1989 | Gotanda | 310/316 |
| 4,888,514 | 12/1989 | Takahashi et al. | 310/316 |
| 4,914,337 | 4/1990 | Takagi | 310/316 |
| 5,021,700 | 6/1991 | Takahashi et al. | 310/316 |
| 5,061,882 | 10/1991 | Takagi | 310/316 |
| 5,130,619 | 7/1992 | Izuno | 310/316 |
| 5,425,704 | 6/1995 | Sakurai et al. | 310/316 |

FOREIGN PATENT DOCUMENTS

| | | | |
|---|---|---|---|
| 0 042 903 A1 | 1/1982 | European Pat. Off. | B06B 1/02 |
| 0 165 407 A2 | 12/1985 | European Pat. Off. | G05D 7/06 |
| 0 172 263 A1 | 2/1986 | European Pat. Off. | B06B 1/02 |
| 0 389 860 A2 | 10/1990 | European Pat. Off. | G10K 9/13 |
| 0 614 704 A2 | 9/1994 | European Pat. Off. | B06B 1/06 |
| WO 96 00318 | 1/1996 | WIPO | D01D 1/04 |

OTHER PUBLICATIONS

Texas Instruments Advanced Linear Seminar Supplement, Chapter 2 Switching Regulators, pp. 2–1 through 2–15.

*Primary Examiner*—Thomas M. Dougherty
*Attorney, Agent, or Firm*—Jones & Askew, LLP

[57] ABSTRACT

An apparatus and method for controlling an ultrasonic transducer preferably including a signal generator circuit, a signal sensing circuit, a modulator circuit, and a bias circuit. The signal generator circuit provides a pulsed drive signal to the ultrasonic transducer. The signal sensing circuit senses the voltage and current of the drive signal. The modulator circuit provides a frequency control signal and an energy control signal to the signal generator circuit corresponding to a detected phase difference between the sensed voltage and the sensed current of the drive signal. The frequency control signal and energy control signal operate to adjust the frequency and energy level, respectively, of the drive signal.

Within the transducer, a movable element in contact with a liquid is preferably positioned corresponding to the level of a dc bias signal provided by the bias circuit. By adjusting the level of the dc bias signal, the flow rate of the liquid is adjusted. By applying the drive signal to the transducer, the viscosity of the liquid is adjusted which establishes a second flow rate of the liquid. When the frequency and energy level of the drive signal are changed, a third flow rate of the liquid is established.

3 Claims, 5 Drawing Sheets

PIEZOELECTRIC TRANSDUCER

MAGNETOSTRICTIVE TRANSDUCER

TRANSDUCER EQUIVALENT CIRCUIT

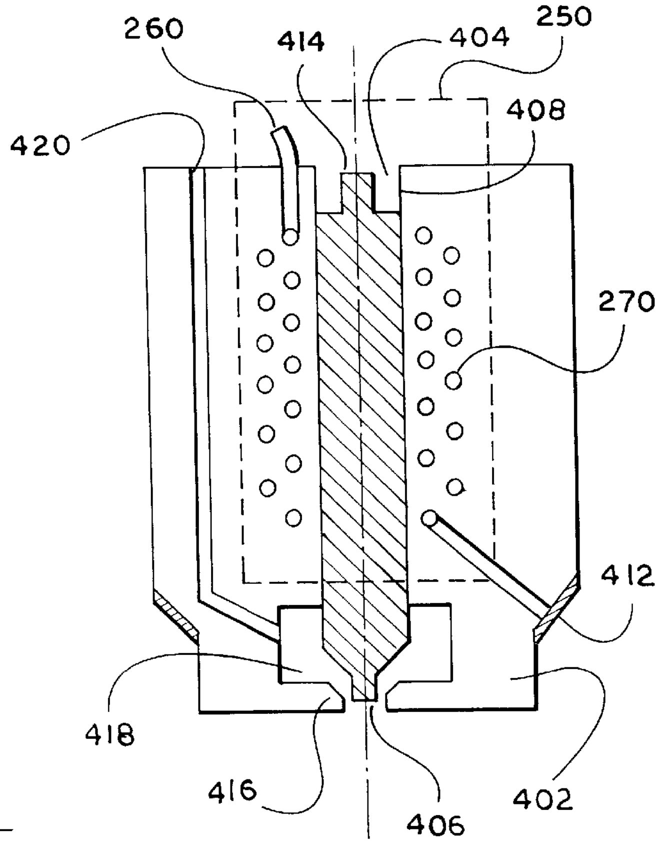
Fig. 4
Fig. 5
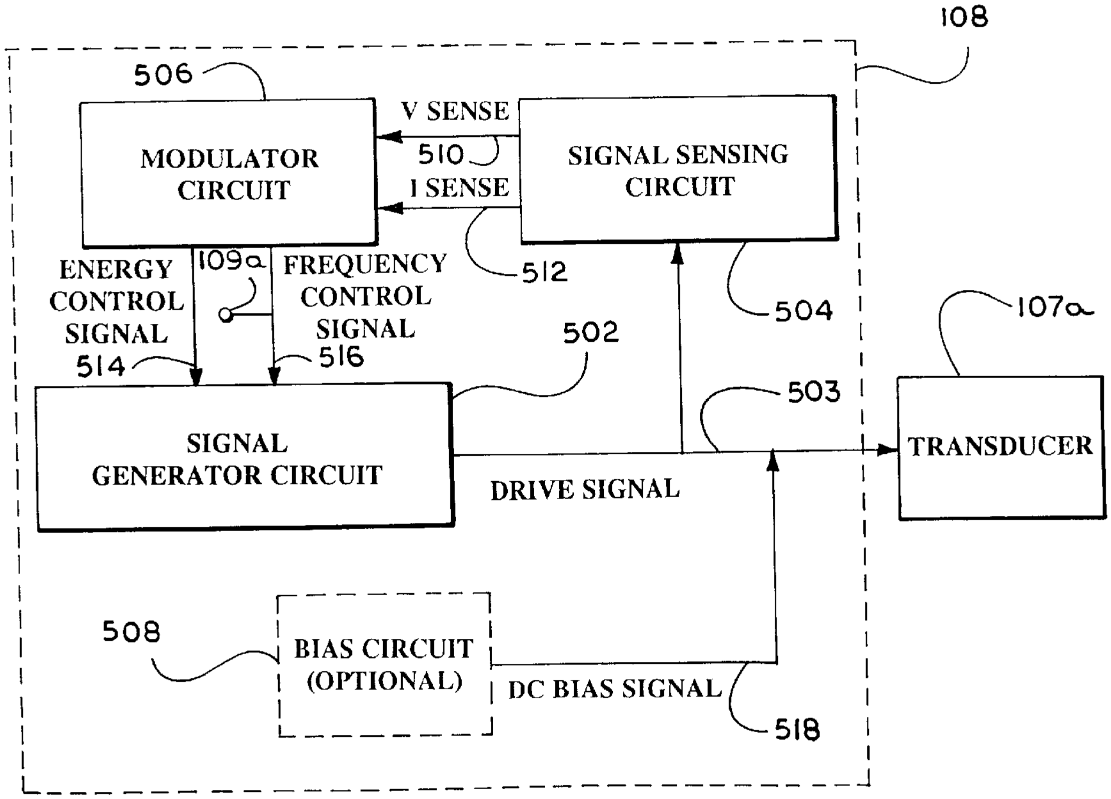

APPARATUS AND METHOD FOR CONTROLLING AN ULTRASONIC TRANSDUCER

TECHNICAL FIELD

The present invention relates to ultrasonic transducers, and more particularly, relates to an apparatus and method for electronically driving and controlling an ultrasonic transducer, and a method for controlling the flow of a liquid using an ultrasonic transducer.

BACKGROUND OF THE INVENTION

Ultrasonic energy has become a useful tool in solving a variety of problems in industrial and commercial applications. Examples of such applications include medical uses such as the imaging of body tissue or of the flow of blood, and signal processing uses such as narrowband filtering of electrical signals. Many of the new and inventive uses of ultrasonic energy require a greater degree of electronic feedback and control.

Feedback is needed to determine if the ultrasonic energy being generated and delivered to a transducer is at the correct frequency and energy level. Getting quick feedback on the ultrasonic energy being delivered is a problem when the electrical characteristics of the transducer, such as the resonant frequency, dynamically change. In order to maintain optimum energy transfer through the transducer, the ultrasonic energy driving the transducer needs to match these electrical characteristics. Quick control of the characteristics of the ultrasonic energy, such as frequency and energy level, is needed to feedback about than optimum energy furthermore, delivering energy to the transducer at the incorrect frequency can undesirably heat the transducer an be destructive to the transducer. Therefore, electronic systems providing such ultrasonic energy to excite an ultrasonic transducer need to be highly efficient, quick reacting, and provide near real-time feedback when less than optimum energy transfer conditions occur.

A particular use of ultrasonic energy is modifying the viscosity of a liquid, thereby modifying the flow rate of the liquid as it passes through an orifice by effecting the rheology of the liquid. This ultrasonic viscosity modification (UVM) is the subject of another U.S. patent application submitted on behalf of the present inventors and is disclosed in U.S. patent application Ser. No. 08/477,689 filed on Jun. 7, 1995, which is hereby incorporated by reference. The UVM patent application describes a system whereby ultrasonic energy is applied to excite a liquid which results in an increase in the flow rate of the liquid. The increase in flow rate of the liquid after excitation with ultrasonic energy advantageously varies from 25 percent to 200 percent when compared to flow rates before excitation.

More specifically, the UVM patent application discloses a system and method for modifying the flow rate of a pressurized liquid, such as a molten thermoplastic polymer. As the pressurized liquid passes through an orifice and is shaped into threadlines or fibers, ultrasonic energy is applied to excite the pressurized liquid. By applying ultrasonic energy to the pressurized liquid, the viscosity of the pressurized liquid is changed in the vicinity of the orifice, thereby increasing the flow rate of the liquid.

The system disclosed in the UVM patent application includes a die housing with a chamber. The chamber is adapted to receive the pressurized liquid from an inlet of the die housing and to expel the pressurized liquid from an exit orifice. A mechanism for applying ultrasonic energy to the pressurized liquid (such as an ultrasonic horn) is located within the chamber. The ultrasonic horn is adapted to apply ultrasonic energy directly to the pressurized liquid within the chamber but not to the die housing. The die housing remains stationary. The application of ultrasonic energy to the liquid is accomplished via a vibrating mechanism in contact with the liquid and a waveguide coupled to the end of the vibrating mechanism (ultrasonic horn).

The system disclosed in the UVM patent application functions by supplying the pressurized liquid to the die housing, exciting the pressurized liquid in the vicinity of the exit orifice with ultrasonic energy without applying ultrasonic energy to the die housing itself, and passing the pressurized liquid out of the chamber through the exit orifice. Thus, the system changes the viscosity of the pressurized liquid by applying ultrasonic energy to the liquid which increases the flow rate of the liquid.

Referring again to the UVM patent application, an ultrasonic power converter and an analog power meter are used to provide a drive signal to a vibrating mechanism or transducer. The described ultrasonic power converter and the analog power meter (drive electronics) can (1) generate the correct alternating current (ac) frequency of the drive signal in order to match the transducer impedance, (2) deliver a specific energy level of the drive signal to transducer, and (3) sense changes in the transducer's resonant frequency so that the frequency and energy level of the drive signal may be adjusted. It would be advantageous if such drive electronics for controlling the transducer provided highly efficient, quick reacting, near real-time control of the drive signal and near real-time feedback when less than optimum energy transfer conditions occur.

First, it would be advantageous to quickly track and correct for changes in a transducer's resonant frequency. It would be advantageous to do so because optimum energy transfer through the transducer can be maintained by supplying the drive signal at the transducer's resonant frequency. In general, ultrasonic transducers are used to convert electrical energy into mechanical energy. Most transducers are reciprocal in that they will also convert the mechanical energy back into electrical energy. Typically, an ultrasonic transducer is manufactured for a specific resonant frequency due to physical dimensions. However, the resonant frequency of the ultrasonic transducer may shift in response to the changes in temperature and loading of the transducer. The shift in resonant frequency leads to electrical impedance matching problems and less than ideal energy transduction.

To solve these problems, certain systems drive ultrasonic transducers and correct for misalignment of the drive signal with respect to the changing resonant frequency of the transducer. For example, a Model 48A100 ultrasonic welding system designed and marketed by the Dukane Corporation, St. Charles, Ill. uses an oscillator to generate the drive signal applied to the transducer. The Model 48A100 system detects the power output delivered to the transducer, conditions the detected power signal, and correspondingly adjusts the frequency of the oscillator. In this manner, the system senses the shift in resonant frequency of the transducer and corrects for misalignment of the drive signal. However, the system is not capable of sensing the changing resonant frequency of the transducer within a period of the drive signal. Furthermore, the system does not provide any operator feedback or telemetry signals corresponding to the rheological properties of the medium excited by the transducer.

It would also be advantageous to provide a smaller, more efficient electronic system for driving and controlling an ultrasonic transducer. Prior art electronic systems, such as in ultrasonic welding applications, use low efficiency designs implemented with large discrete linear power amplifiers. Typical energy transfer efficiencies for such prior electronic systems are approximately thirty percent. When the energy level needed to drive an ultrasonic transducer is large, efficiency in driving the ultrasonic transducer may become a concern for heat dissipation and energy conservation reasons. Thus, it is advantageous to drive and control an ultrasonic transducer using smaller, more energy efficient electronics that are less costly than prior art electronic systems.

Finally, it would be advantageous to precisely adjust the flow of liquid as the liquid flows through an orifice. The previously mentioned UVM patent application describes a fuel injector apparatus having a nozzle orifice and utilizing an ultrasonic transducer for injecting liquid fuel into a cylinder of an internal combustion engine. Ultrasonic energy is applied to the pressurized liquid fuel as it passes through the nozzle orifice to enhance the atomization of the liquid fuel and to facilitate deeper penetration into the engine cylinder before combustion occurs. As described, the application of ultrasonic energy acts as a flow adjustment on the flow of liquid fuel through the nozzle orifice. It would be advantageous to precisely control liquid flow in an injection orifice with an ultrasonic transducer to enhance internal combustion engine performance during cold starts and warm-up conditions. Furthermore, more control of fuel flow is desired in order to reduce pollution from unexpended fuel expelled from the engine cylinder. Thus, there is a need for an apparatus and method of using an ultrasonic transducer to provide more control of the flow rate of a liquid.

In summary, there is a need for an improved method and apparatus to drive an ultrasonic transducer so as to (1) quickly control the drive signal applied to the ultrasonic transducer, (2) provide useful and timely feedback about the resonant frequency of the ultrasonic transducer, (3) provide telemetry signals corresponding to the rheological properties of the medium in contact with the transducer, (4) drive and control the ultrasonic transducer with electronics that are smaller, weigh less, and cost less than prior electronic systems, and (5) provide more control of the flow rate of liquid using the ultrasonic transducer.

SUMMARY OF THE PRESENT INVENTION

The present invention generally provides an apparatus and a method for electronically controlling an ultrasonic transducer, and a method for controlling the flow of a liquid using an ultrasonic transducer.

Stated generally, the preferred embodiment of the present invention provides a signal generator, preferably a high efficiency switching regulator, for providing a drive signal to the ultrasonic transducer. The drive signal has a frequency and an energy level and is preferably a pulsed signal. The present invention also provides a feedback mechanism, preferably a signal sensing circuit and a modulation circuit, for providing a modulation control signal to the generator. The value of the modulation control signal corresponds to a phrase difference between the voltage level of the drive signal and the current level of the drive signal. The value of the modulation control signal preferably provides a substantially real-time indication of the viscosity of a liquid when the liquid is in contact with the ultrasonic transducer. This real-time indication may be provided as an external telemetry signal generator, preferably a switching regulator, adjusts the frequency of the drive signal and the energy level of the drive signal in response to changes in the value of the modulation control signal Preferably, the energy level of the drive signal is changed to a second energy level when the value of modulation control signal exceeds a first predetermined value. The second energy level is higher than the initial energy level the drive signal. Preferably, the energy level of the drive signal is changed to a third level when the value of the modulation control signal exceeds a second predetermined value. The third energy level is higher than the second energy level. Furthermore in the preferred embodiment, a dc bias circuit provides a dc bias signal to the ultrasonic transducer.

More particularly described, an embodiment of the present invention provides a signal generator, a signal sensing circuit, and a modulator. The signal generator provides a drive signal to drive the ultrasonic transducer. The signal generator preferably includes a pulse width comparator to provide the drive signal. The signal generator circuit also preferably includes an oscillator which provides an oscillating signal with an oscillation frequency to the pulse width generator. The oscillation frequency of the oscillating signal corresponds to the value of a frequency control signal provided by the modulator. The signal sensing circuit provides a voltage sense signal in response to the voltage level of the drive signal and provides a current sense signal in response to the current level of the drive signal. The modulator provides the frequency control signal and an energy control signal to the signal generator. The value of the frequency control signal and the value of the energy control signal correspond to a phase difference between the voltage sense signal and the current sense signal. The value of the frequency control signal preferably provides a substantially real-time indication of the viscosity of a liquid when the liquid is in contact with the ultrasonic transducer. This real-time indication may be provided as an external telemetry signal.

In this embodiments, the signal generator, preferably a switching regulator, adjusts the frequency of the drive signal in response to the voltage level of the frequency control signal. The signal generator also adjusts them energy level of the drive signal in response to the voltage level of the energy control signal, preferably by changing the duty cycle of the drive signal. In the preferred embodiment, the energy level of the drive signal may be adjusted to distinct levels by varying the duty cycle of the drive signal depending on the value of the energy control signal.

The preferred embodiment may also include a bias circuit to provide a dc bias signal to the ultrasonic transducer. Within the transducer, a movable element in contact with a liquid is positioned corresponding to the level of a dc bias signal.

The present invention also provides a method of controlling an ultrasonic transducer. The method includes a step of providing a drive signal to drive the ultrasonic transducer. Next, a modulation control signal is provided that corresponds to a phase difference between the voltage level of the drive signal and the current level of the drive signal. In response to a change in the value of the modulation control signal, the frequency of the drive signal and the energy level of the drive signal are adjusted. The energy level of the drive signal is preferably changed to distinct levels by varying the duty cycle of the drive signal.

The present invention also provides a method of using an ultrasonic transducer having a movable element to adjust the flow rate of a liquid. First, the movable element is positioned within the liquid to establish a first liquid flow rate, preferably by applying a dc bias signal to the transducer. Next, by applying the drive signal (ac drive signal) to the transducer, the movable element is caused to vibrate. The vibrations of the movable element change the viscosity of the liquid and result in a second flow rate of the liquid. When the frequency of the drive signal and energy level of the drive signal are changed, a third flow rate of the liquid is established. Preferably, the energy level of the drive signal is changed by varying the predetermined or nominal duty cycle of the drive signal. Preferably, the frequency of the drive signal is changed by varying a predetermined frequency of the drive signal. The predetermined frequency of the drive signal corresponds to the characteristic impedance of the transducer at resonance.

Another embodiment of the method of using an ultrasonic transducer having a movable element to adjust the flow rate of a liquid begins by applying a first level dc bias signal to the ultrasonic transducer. At thigh first level, the movable element occupies a first position within the liquid. Next, the first level is changed to a second level dc bias signal. At this second level, the movable element moves from the first position within the liquid to a second position within the liquid. While the movable element occupies this second position, the liquid has a second flow rate.

As a result of providing the improved method and apparatus to drive an ultrasonic transducer, useful and timely feedback about the resonant frequency of the ultrasonic transducer can be advantageously provided by a detected phase difference between the voltage and current of the drive signal applied to the ultrasonic transducer. The drive signal can be controlled within a period of the drive signal by adjusting the frequency and energy level corresponding to the value of the detected phase difference. The improved method and apparatus more efficiently drives and controls the ultrasonic transducer by using a switching regulator to provide the drive signal. The improved method and apparatus provides more control of the flow rate of liquid effected by the ultrasonic transducer by applying a dc bias signal to the ultrasonic transducer.

Although the preferred embodiment of the present invention is directed towards electronics for an ultrasonic transducer in a diesel combustion engine, it should be understood that the present invention may be applied to a broad variety of other devices including, but not limited to, a shock absorbing damping device, an anti-lock braking system enhancement, a turbine engine enhancement, and an enhanced liquid metering system for industrial process control.

In summary, it is an object of the present invention to provide an improved apparatus and method for controlling an ultrasonic transducer.

It is a further object, of the present invention to provide an improved apparatus and method for adjusting the flow rate of liquid passing through an operational orifice using an ultrasonic transducer having a movable element by controlling the position of the movable element with a dc bias signal and also by applying ultrasonic energy to the liquid with a drive signal.

It is still a further object of the present invention to provide telemetry signals indicating and corresponding to the rheological properties of the medium in contact with the ultrasonic transducer.

It is still a further object of the present invention to maintain maximum energy transfer from the drive signal to the ultrasonic transducer by providing substantially real-time feedback on the resonant frequency of the ultrasonic transducer and substantially real-time control of the drive signal exciting the ultrasonic transducer.

It is still a further object of the present invention to provide a more energy efficient apparatus for controlling an ultrasonic transducer.

BRIEF DESCRIPTION OF THE DRAWINGS

FIG. 4 is a mechanical illustration of a magnetostrictive transducer of the preferred embodiment within an ultrasonic fuel injector shown in a sectional view.

FIG. 5 is a block diagram of the ultrasonic viscosity modification electronic components of the preferred embodiment.

DETAILED DESCRIPTION OF THE PREFERRED EMBODIMENT

Diesel Engine Fuel System

Figure 1:
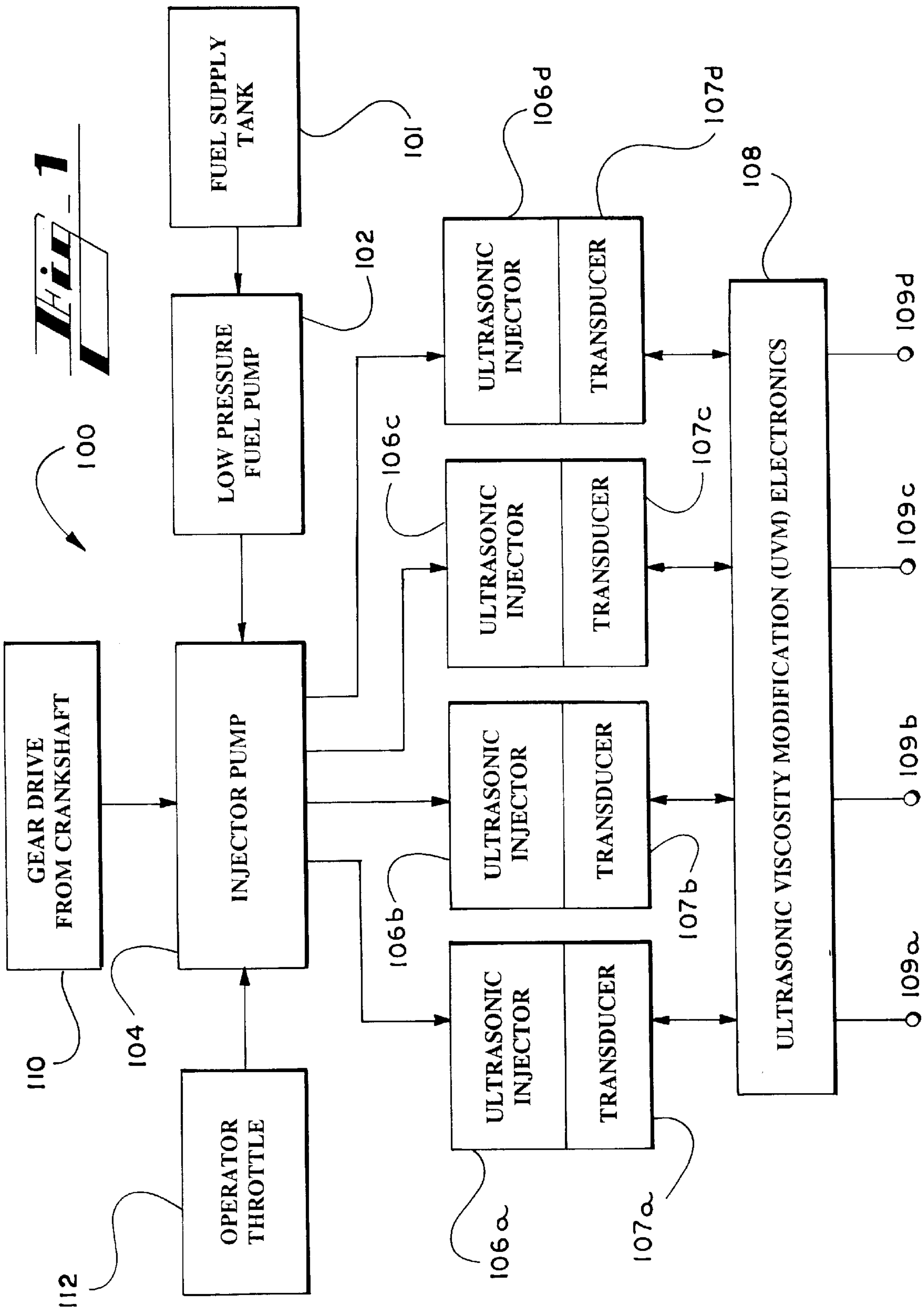
FIG. 1 is a block diagram of a diesel fuel injection system containing the preferred embodiment.

Referring now to the drawings, in which like numerals indicate like elements throughout the several figures, FIG. 1 illustrates the preferred embodiment for an apparatus and method for electronically controlling an ultrasonic transducer in the context of a diesel engine fuel system of a four-cylinder diesel engine. Essentially, the diesel engine fuel system 100 in FIG. 1 includes a fuel supply tank 101 which feeds a low pressure fuel pump 102 which in turn feeds a injector pump 104. The injector pump 104 has a set of ultrasonic fuel injectors 106*a–d*, one injector for each cylinder in the diesel engine. Each of the ultrasonic fuel injectors 106*a–d* has an ultrasonic transducer 107*a–d* within the injector 106*a–d*. Each of the ultrasonic transducers 107*a–d* is in contact with liquid fuel and is electrically driven by ultrasonic viscosity modification (UVM) electronics 108.

The UVM electronics 108 is electrically connected to each of the ultrasonic transducers 107*a–d*. Excitation or drive signals are provided by the UVM electronics 108 to each of the ultrasonic transducers 107*a–d*. At the same time, signals are received by the UVM electronics 108 from each of the ultrasonic transducers 107*a–d*.

As mentioned above, fuel flows from the fuel supply tank 101, to the low pressure pump 102, and then to the injector pump 104. In this manner, pressurized fuel is provided to the injector pump 104. The injector pump 104 is powered by a gear drive 110 from a crankshaft from the diesel engine (not shown). In response to an operator throttle 112, the injector pump 104 delivers bursts of pressurized fuel to each of the fuel injectors 106*a–d* UVM electronics 108 controls each of the ultrasonic transducers 107*a–d* which in turn control the viscosity of the fuel as it passes through the fuel injector nozzle orifices.

To control the viscosity of the fuel, the UVM electronics 108 preferably senses the voltage and current of the drive signal applied to each of the ultrasonic, transducers 107*a–d*. When a burst of fuel arrives at one injector 106*a*, the increase in liquid pressure causes a phase difference between the voltage and current of the drive signal applied to the transducer 107*a* associated with the injector 106*a*. This phase difference is detected preferably by the UVM electronics 108. The UVM electronics 108 adjusts the energy level and the frequency of the drive signal until the phase difference is substantially eliminated.

Advantageously, the UVM electronics 108 can detect the phase difference between the voltage and current of the drive signal and can respond with adjustments to the energy level and frequency of the drive signal within a period of the drive signal. In the preferred embodiment, the drive signal is a pulsed signal nominally operating at 20 kHz. Thus, the UVM electronics 108 can preferably detect the phase difference and preferably respond with adjustments to the energy level and frequency of the drive signal within 50 microseconds. The detection of the phase difference allows the UVM electronics 108 to indicate viscosity characteristics of the liquid in contact with the transducer 107*a–d* via external telemetry output signals 109*a–d* corresponding to each of the transducers 107*a–d*.

The external telemetry output signals 109*a–d* can be provided to computerized processors (not shown) for comparing empirical phase shifts for a given liquid to reference data on the given liquid. Alternatively, the external telemetry output signals 109*a–d* can be provided to an analog meter (not shown) as an indication of viscosity. Those skilled in the art will quickly appreciate different uses of the external telemetry output signals 109*a–d* to indicate, in a near real-time manner, the viscosity characteristics of the liquid in contact with the transducer 107*a–d*.

The detection of the phase difference also allows the UVM electronics 108 to control the drive signal. By controlling the drive signal to each of the ultrasonic transducers 107*a–d* in this manner, the UVM electronics 108 functions to control the transducer 107*a–d* within each of the injectors 106*a–d*. By controlling the transducers 107*a–d*, the UVM electronics 108 directly affects the viscosity of the fuel and, thereby, the flow of the fuel through each of the injectors 106*a–d*.

If an injector 106*a* becomes clogged, the UVM electronics 108 is operative to sense the clogged injector 106*a* by sensing the magnitude of the phase difference between the voltage and current of the drive signal. The UJVM electronics 108 increases the energy level of the drive signal delivered to the corresponding transducer 107*a* to unclog the clogged injector 106*a*. Increasing the energy level of the drive signal helps to clear any obstructing particulate matter from within the injector 106*a*.

Transducers

Figure 2A:
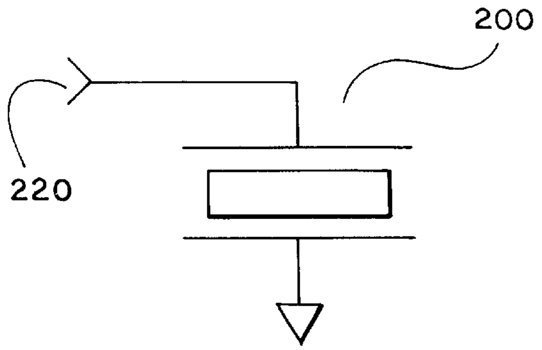
FIGS. 2*a* and 2*b* are diagrams of two types of ultrasonic transducers.
Figure 2B:
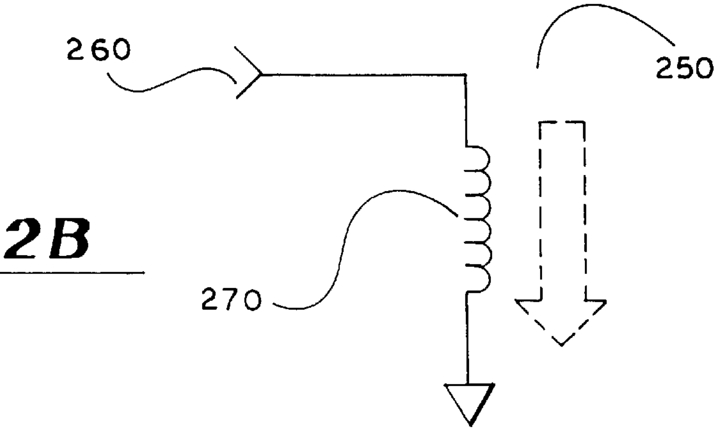

FIGS. 2*a* and 2*b* are diagrams of two types of transducers used with the preferred embodiment of the present invention in the diesel fuel injection system illustrated in FIG. 1. As previously mentioned, transducers are devices which convert energy from one form into another. Transducers vary in physical size, frequency of excitation, and power level. Those skilled in the art will recognize that since wavelength varies with frequency, the larger the transducer, the lower the excitation frequency. Transducers can also vary in what mechanism is used for transduction. Two such mechanisms for transduction are piezoelectricity and magnetostriction.

Essentially, piezoelectricity is a phenomenon where electrical energy is converted into mechanical energy, and vice versa. Certain crystals which exhibit this phenomenon produce an electrical surface charge when subjected to a mechanical strain. Conversely, if the crystal material is subjected to an electric field, the crystal material mechanically deforms. This piezoelectric phenomenon renders such a material useful in many electronics applications. Piezoelectric characteristics occur naturally in some crystal materials, such as quartz or barium titanate, and may be artificially induced in other ceramic polycrystaline materials.

FIG. 2*a* is a diagram of a piezoelectric transducer 200 which may be used as one of the ultrasonic transducers 107*a–d* of FIG. 1. The piezoelectric transducer 200 has an excitation drive input 220 connected to the piezoelectric transducer 200. Upon applying a drive signal to the excitation drive input 220, a voltage potential is created across the piezoelectric material within the piezoelectric transducer 200. The voltage potential across the piezoelectric material creates an electric field. This electric field forces a mechanical deformation in the piezoelectric material. In the preferred embodiment, the piezoelectric transducer 200 may be constructed of piezoelectric materials including, but not limited to, quartz, barium titanate, and piezoceramic materials. A variety of piezoelectric transducers 200 are commercially available from Branson Sonic Power Company, Danbury Conn., such as a Type 402 Converter nominally operating at 20 kHz.

Magnetostriction is also a mechanism for energy transduction. Magnetostriction is a phenomenon where magnetic energy is converted into mechanical energy, and vice versa. Magnetostrictive material becomes mechanically strained when subjected to a magnetic field. For magnetostrictive transducers in general, the mechanical straining effect is quadratic in nature. Thus, a direct current (dc) bias signal is generally provided to the magnetostrictive transducer in order to linearly operate the magnetostrictive transducer.

FIG. 2*b* is a diagram of a magnetostrictive transducer 250 which also may be used as one of the ultrasonic transducers 107*a–d* of FIG. 1. The magnetostrictive transducer 250 has an excitation drive input 260 which is connected to a drive coil 270. Upon applying a drive signal to the excitation drive input 260, a magnetic field is created by the drive coil 270. The magnetic field mechanically strains the magnetostrictive material within the magnetostrictive transducer 251. In the preferred embodiment, the magnetostrictive transducer 250 may be made of materials including, but not limited to, nickel, permalloy, ETREMA TERFENOL-D® (manufactured by Etrema Products, Inc., Ames, Iowa), depending on the targeted application of the magnetostrictive transducer 250. A direct current (dc) bias signal is generally provided on the excitation drive input 260 in order to operate the magnetostrictive transducer 250 in a linear mode of operation. Magnetostrictive transducers 200 are commercially available from such companies as Lewis Corporation of Oxford, Conn.

Figure 3:
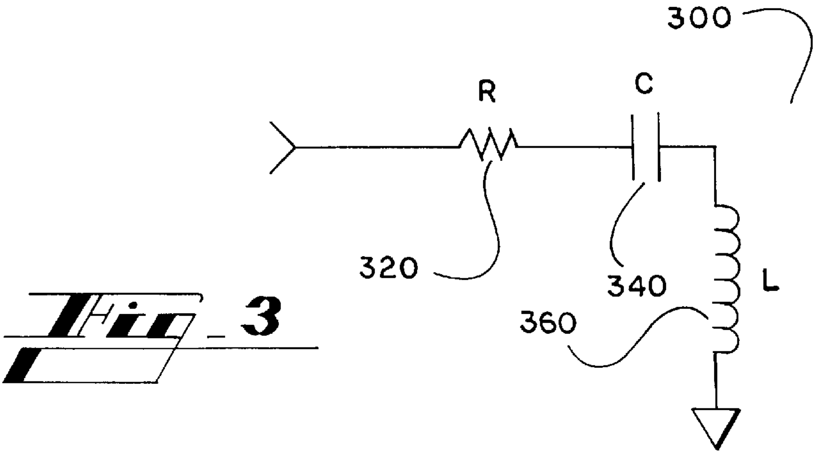
FIG. 3 is an electrical schematic diagram of an equivalent electrical circuit for an ultrasonic transducer.

FIG. 3 is an approximation of an equivalent electrical circuit for both the piezoelectric transducer 200 (FIG. 2*a*) and the magnetostrictive transducer 250 (FIG. 2*b*). These transducers can be electrically approximated by a resistor (R) 320 in series with a capacitor (C) 340 further in series with an inductor (L) 360 to form an equivalent circuit 300.

In this manner, the transducer acts as a resonant RLC circuit. The characteristic resonant frequency of the transducer is determined from the following formula:

$$\text{Frequency of Resonance} = 1/\left(2\pi\sqrt{LC}\right)$$

As a result, when, the transducer (e.g., one of the ultrasonic transducers 107*a–d* from FIG. 1) is excited or driven at this resonant frequency, maximum energy is transformed from electrical energy to mechanical energy. The transducer can be destructively altered due to heat or excessive voltages if the transducer is driven at a frequency other than the resonant frequency and at a high energy level. Those skilled in the art will be familiar with series RLC resonant circuits, their characteristic resonant impedance, and the concept of maximum power or energy transfer. While these equivalent electrical characteristics stay constant in an ideal application, they can shift due to temperature variations and mechanical loading of the transducer. Therefore, to maintain maximum energy transfer, it is advantageous to quickly track the change of transducer impedance, and compensate for any change in transducer impedance.

FIG. 4 illustrates the physical details of a magnetostrictive transducer in a sectional view within an ultrasonic fuel injector 106*a* (FIG. 1) from the preferred embodiment. Referring now to FIG. 4 and FIG. 2*b*, a magnetostrictive transducer 250 is shown within an ultrasonic injector 106*a*. The ultrasonic injector 106*a* has a stationary nozzle 402 having a longitudinal bore 404. On one end, the longitudinal bore 404 has an exit orifice 406 and a needle seat 416 surrounding the exit orifice 406. On the other end, the longitudinal bore 404 has a larger opening 408 on the other end. A drive coil 270 of the magnetostrictive transducer 250 is symmetrically disposed within the stationary nozzle 402. The drive coil 270 surrounds the longitudinal bore 404. One end of the drive coil 410 is an excitation drive input 260, while the opposite end is grounded. The opposite end of the drive coil 270 is grounded by being connected to a metal contact ring 412 on the outside of the stationary nozzle 402.

A movable element 414, called a needle, is part of the transducer 250 and is disposed within the longitudinal bore 404. The movable element 414 is made of a magnetostrictive material, preferably nickel, and is operative to vibrate within the bore 404. The movable element 404 is normally biased towards the exit orifice 406 by a spring (not shown) until the movable element 414 comes in contact with the needle seat 416, thus occluding the exit orifice 406. The movable element 414 is normally positioned by the oil pressure from the injection pump 104 against the biasing force of the spring (not shown). However, the movable element 414 can be selectively positioned against this biasing force within the bore 408 of the nozzle 402 by applying a dc bias signal to the excitation drive input 260.

On the end of the stationary nozzle 402 having the exit orifice 406, there is a liquid chamber 418 in direct contact with the bore 404. Fluid flows through the ultrasonic injector 206*a* by first entering a liquid inlet 420, which is connected to the liquid chamber 418. Next, the liquid flows through the liquid chamber 418 and then out of the exit orifice 406 when the movable element 414 is not in contact with the needle seat 416.

If the movable element 414 is positioned with the de bias signal so that it is not blocking the exit orifice 406 liquid flows through the injector 106*a* while in contact with the movable element 414 near the exit orifice 406. Alternatively, the dc bias could serve to close or hold closed the movable element 414 against needle seat 416 surrounding the exit orifice 406. An alternating current (ac) drive signal may be applied to the excitation drive input 260. The ac drive signal is applied to induce the movable element 414 to vibrate. The energy from the vibrations of the movable element 414 is absorbed by the liquid near the exit orifice 406. The absorbed energy changes the rheology of the liquid, thereby changing the flow rate of the liquid.

As noted above, the movable element 414 of the transducer 250 may be positioned so to block the exit orifice 406. This may be accomplished by changing the level of the dc bias signal Blocking of the exit orifice 406 provides a coarse flow adjustment of liquid flowing through the injector 106*a*. En other words, the flow rate of liquid flowing through the injector 106*a* is controlled by the transducer 250.

Ultrasonic Viscosity Modification Electronics

FIG. 5 is a block diagram of the preferred components of the UVM electronics ROB of FIG. 1. The UVM electronics 108 controls a group of ultrasonic transducers 107*a–d* (via drive signals and dc bias signals) in order to sense and control the viscosity of a liquid and, thereby, control the flow rate of the liquid. However, for simplicity, the UVM electronics ROB is described in the context of a single ultrasonic transducer 107*a*. Those skilled in the art will appreciate how the below described UVM electronics 108 may be duplicated and applied to other transducers requiring different frequencies and energy levels to operate.

Referring now to FIG. 5, the UVM electronics 108 preferably includes a signal generator circuit 502, a signal sensing circuit 504, a modulator circuit 506, and an optional bias circuit 508. The signal generator circuit 502 provides a drive signal 503 to the transducer 107*a*. In the preferred embodiment, this drive signal 503 is a 20 kHz periodic pulsed signal. Those skilled in the art will recognize that the nominal frequency of the drive signal 503 will depend upon the nominal resonant frequency characteristics of the exact kind of transducer 107*a* used and the characteristics of the liquid in contact with the transducer 107*a*.

The signal sensing circuit 504 and the modulator circuit 506 preferably make up a feedback mechanism to provide near real-time feedback on the drive signal 503 generated by the signal generator circuit 502. The signal sensing circuit 504 detects the voltage of the drive signal 503 and provides a sensed voltage signal 510 to the modulator circuit 506. The signal sensing circuit 504 also detects the current of the drive signal 503 and provides a sensed current signal 512 to the modulator circuit 506.

The modulator circuit 506 preferably completes the feedback mechanism by providing an energy control signal 514 and a frequency control signal 516 to the signal generator circuit 502. The energy control signal 514 and the frequency control signal 516 are collectively referred to as a modulation control signal. The modulator circuit 506 detects the phase difference between the sensed voltage signal 510 and the sensed current signal 512. When this phase difference begins to exceed a threshold value, the resonant impedance of the transducer 107*a* is beginning to shift. In order to track the resonant shift and reduce the phase difference, the level of the energy control signal 514 and the frequency control signal 516 are each changed.

In response to a change in the level of the frequency control signal 516, the signal generator circuit 502 changes the frequency of the drive signal 503 in proportion to the phase difference. If the level of the frequency control signal 516 is negative, the frequency of the (drive signal 503 is decreased. Conversely, if the level of the frequency control signal 516 is positive, the frequency of the drive signal 503 is increased.

In response to a change in the level of the energy control signal 514, the signal generator circuit 502 changes the energy level of the drive signal 503. When the level of the energy control signal 514 is increased from a first predetermined value (low power mode) to a second predetermined value (high power mode), the energy level of the drive signal 503 is increased from a first energy level (low power mode) to a second energy level (high power mode).

The detected phase difference corresponding to the level of the modulation control signal, preferably the frequency control signal 516, is provided as an external telemetry output signal 109*a*. In this manner, the level of the external telemetry output signal 109*a* can be compared to reference data or metered to determine rheological properties (viscosity) of the liquid in contact with the ultrasonic transducer 107*a* in a near real-time manner.

The preferred method of controlling an ultrasonic transducer is described in the context of a diesel fuel injection system 100 as illustrated in FIGS. 1 and 5. Each of the ultrasonic injectors 107*a–d* in the diesel engine fuel system of FIG. 1 is controlled by the UVM electronics 108 as described herein and illustrated in FIG. 5. (Generally described, a drive signal 503 is provided to drive the ultrasonic transducer 107*a*. A modulation signal, preferably including a frequency control signal 516 and an energy control signal 514, is provided with a value corresponding to a phase difference between the voltage level and current level of the drive signal 503. In response to the phase difference, the UVM electronics 108 adjusts the frequency and energy level of the drive signal 503 until the phase difference is substantially eliminated. Specifically, the energy level of the drive signal 503 is increased to a second energy level when the value of the energy control signal 514 exceeds a first predetermined value corresponding to the low power mode.

While the signal generator circuit 502 excites the transducer 107*a* with the drive signal 503, the bias circuit 508 preferably provides a direct current (dc) bias signal 518 to the transducer 107*a*. As previously mentioned, some transducers require dc biasing to operate in a linear manner. If the transducer 107*a* is a magnetostrictive type of transducer, similar to the magnetostrictive transducer 250 of FIG. 4, the optional bias circuit 508 will bias the transducer 107*a* to operate in a linear manner. However, in other embodiments of the present invention not requiring dc biasing of the transducer 107*a*, the optional bias circuit 508 and the dc bias signal 518 are not necessary elements.

The signal generator circuit 502 and the dc bias circuit 508 can also control the flow of a liquid effected by the transducer 107*a*. If the transducer 107*a* is a magnetostrictive type of transducer, similar to the magnetostrictive transducer 250 of FIG. 4, the movable element 414 (FIG. 4) can be positioned in response to the level of the dc bias signal 518. The dc bias signal 518 from the dc bias circuit 508 adjusts the flow rate of liquid effected by the transducer 107*a*. By varying the level of the dc bias signal 518, the flow rate of the liquid can be further adjusted. Similarly, the drive signal 503 from the signal generator circuit 502 adjusts the flow rate of liquid effected by the transducer 107. By varying the frequency and the energy level of the drive signal 503, the flow rate of the liquid can be further adjusted.

Figure 6:
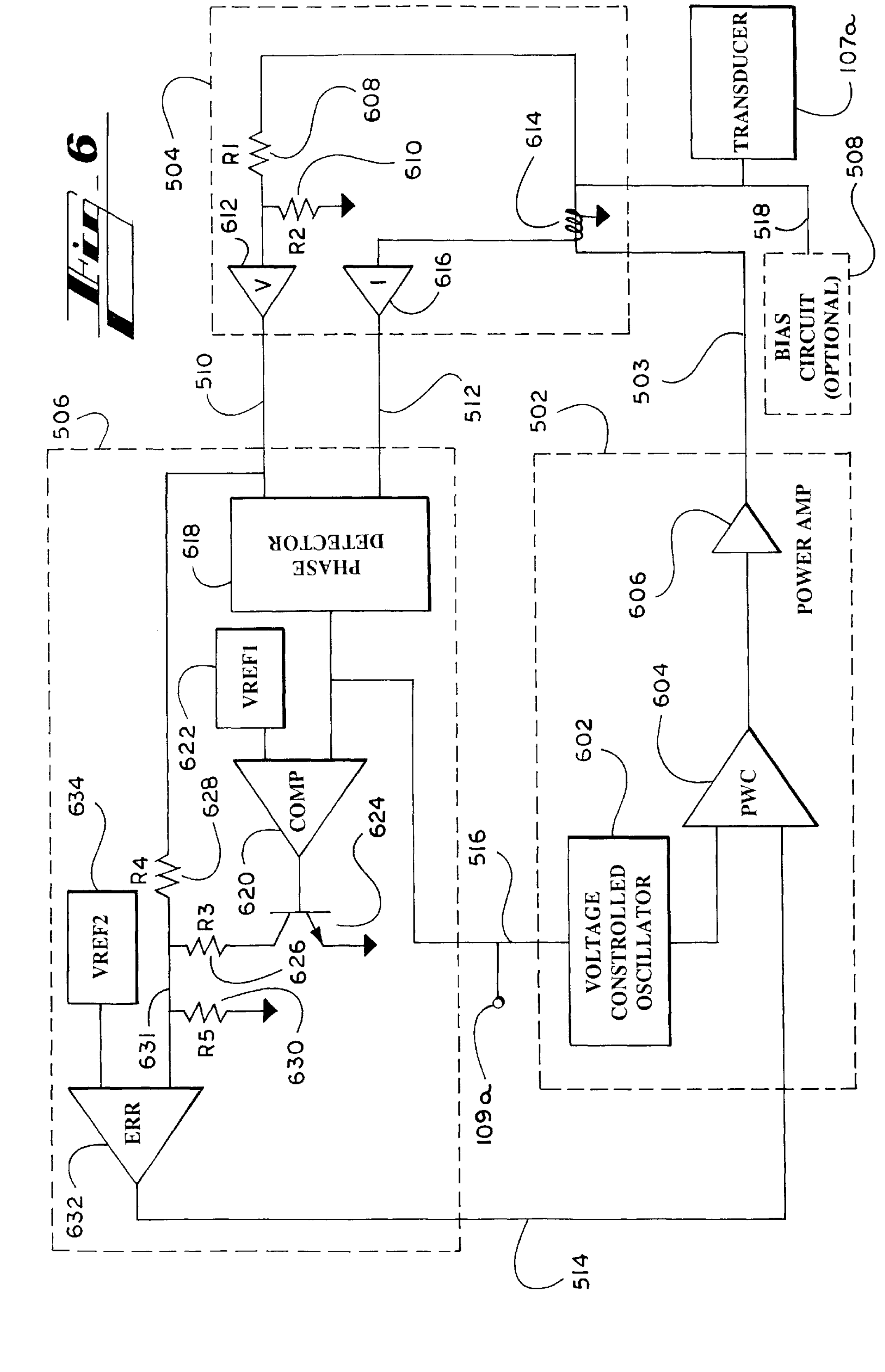
FIG. 6 is a schematic/block diagram of the ultrasonic viscosity modification electronic components of the preferred embodiment.

FIG. 6 is a more detailed schematic/block diagram of preferred components of the UVM electronics 108 from FIG. 5. Referring now to FIG. 6, the signal generator circuit 502 is preferably made up of a voltage controlled oscillator (VCO) 602, a pulse width comparator 604, and a power amplifier 606. An output of the VCO 602 is connected to the pulse width comparator 604. The VCO 602 acts as a clock for the pulse width comparator 604.

In the preferred embodiment, the VCO 602 provides a variable frequency, constant amplitude triangle wave signal that, when compared to the voltage of the energy control signal 514, results in variable frequency and duty cycle pulses that comprise the drive signal 503. In the preferred embodiment, the voltage level of the energy control signal 514 controls the pulse width of the drive signal 503 generated by the pulse width comparator 604. In this manner, the level of the energy control signal 514 changes the energy level of the drive signal 503 by preferably varying the duty cycle of the drive signal 503. Nonetheless, the present invention is not limited to changing the energy level of the drive signal 503 by varying the duty cycle. Those skilled in the art will recognize there are other ways to change the energy level of the drive signal 503 such as by changing the amplitude of the drive signal 503.

The signal generated by the pulse width comparator 604 is amplified by the power amplifier 606. The power amplifier 606 amplifies the drive signal 503 to a predetermined energy level that is sufficient to drive and control the transducer 107*a*. In the preferred embodiment, the power amplifier 606 is implemented using power metal oxide field effect transistors (MOSFET) in a conventional power amplifier configuration when driving a transducer 106*a* of a magnetostrictive type. A power amplifier 606 with a single-ended drive arrangement is typically used for higher Q transducers 107*a*, such as piezoelectric transducers. Those skilled in the art are familiar with power MOSFET devices and conventional large signal amplifier configurations, such as complementary symmetry power amplifiers, push-pull amplifiers, and single-ended amplifier configurations. Other large signal amplifier configurations using other types of power semiconductor devices capable of operating at ultrasonic frequencies could be used for the present invention. Furthermore, those skilled in the art will recognize that the power amplifier 606 becomes an optional component of the signal generator circuit 502 if the pulse width comparator 604, can produce a drive signal 503 with a sufficient energy level for a given application.

In the preferred embodiment, the signal generator circuit 502 is implemented using a switching regulator assembly, preferably a TL 1451 AC dual pulse width modulated control circuit from Texas Instruments, Irvine, Calif. In general, linear regulators use the variable resistance of a transistor to control the current flow through the transistor, thus regulating the energy output. However, those skilled in the art will appreciate that switching regulators operate in a more efficient mode by chopping the output voltage. Thus, the switching regulator operates more efficiently by being in either the fully saturated "on" position or fully "off" position. The active element of the switching regulator (the pulse width comparator 602) controls the energy output by controlling the duty cycle of the chopping action. In the preferred embodiment, this allows for a more energy efficient implementation of the UVM electronics 108 for controlling a transducer 107*a*.

In the preferred embodiment, the drive signal 503 is provided by components within the signal generator circuit 502 to the transducer 107*a*. A signal sensing circuit 504 preferably detects the voltage of the drive signal 503 proximately close to the transducer 107*a* using a resistive divider network comprised of R1 608 and R2 610. In the preferred embodiment, the nominal value of R1 608 is 1000 ohms and the value of R2 620 is 100 ohms. The voltage drop across R2 610 is fed into a voltage signal buffer amplifier 612 which generates the sensed voltage signal 510. Those skilled in the art will be familiar with using a resistive divider network to sample voltage.

The signal sensing circuit 504 preferably detects the current of the drive signal 503 using a current sense transformer 614. The sensed current is then fed into a current signal buffer amplifier 616 which generates the sensed current signal 512.

After detecting the voltage and current of the drive signal 503, the modulator circuit 506 provides an energy control signal 512 and a frequency control signal 516 to the signal generator circuit 502. The sensed voltage signal 510 and the sensed current signal 512 are preferably connected to inputs of a phase detector 618. The phase detector 618 outputs a frequency control signal 516. This frequency control signal 516 has a voltage level in proportion to the difference in phase between the sensed voltage signal 510 and the sensed current signal 512. Although the present invention is not limited to any specific implementation of a phase detector 618 (the preferred embodiment detects zero crossings for each input signal (the sensed voltage signal 512 and the sensed current signal 512). The preferred embodiment then performs a logical AND to digitally multiply the input signals together. When the multiplied input signals are rectified and low-pass filtered, a dc component is produced that is proportional to the phase difference between the input signals. As a result, the frequency control signal 516 generated by the phase detector 618 is connected to the VCO 602. In this manner, the level of the frequency control signal 526 controls the oscillation frequency of the voltage controlled oscillator In addition to being connected to the VCO 602, the frequency control signal 516 is also connected to a comparator (comp) 620. A first voltage reference (Vref1) 622 is also connected to the comparator 620. Vref1 622 is preferably maintained at positive 2.4 volts. A transmission gate 624 is connected to an output of the comparator 620. The transmission gate 624 or transistor is connected between ground and another resistive divider network made up of resistors R3 626, R4 628 and R5 630. Specifically, one end of R4 628 is connected to the sensed voltage signal 510. The other end of R4 628 is connected to one end of R3 626, one end of R5 530, and an error input 631 of a differential error amplifier 632. The other end of R5 630 is connected to ground while the other end of R3 626 is connected to the transmission gate 624 In the preferred embodiment, the resistive values for R3, R4, and R5 are as follows: R3 626=500 ohms, R4 628=2500 ohms, and R5 630=1000 ohms.

When the frequency control signal 516 is less than Vref1 622, the output of the comparator 620 is at a low voltage level, preferably zero to 0.5 volts. While the output of the comparator 620 is at the low voltage level, the transmission gate 624 is kept in the off position. However, when the frequency control signal 516 exceeds the level of the Vref1 622, the output of the comparator 620 changes from a low voltage level to a high voltage level, preferably greater than 0.7 volts. In response to the high voltage level, the transmission gate 624 turns on. In this configuration, the transmission gate 624 operates as a switch to toggle between different voltage levels on the error input 631 of a differential error amplifier 632. Thus, when the transmission gate 624 turns on, the voltage at the error input 631 is changed because of the additional voltage drop across R3 626.

The differential error amplifier 632 is connected to a second voltage reference (Vref2) 634. Vref2 634 is preferably maintained at positive 2.4 volts,. The energy control signal 514 is generated by the differential error amplifier 632 and is connected to the pulse width comparator 604. When the voltage level at the error input 631 exceeds the voltage level of VreF2 634, the energy control signal 514 changes from a low voltage level to a high voltage level. The low voltage level of the energy control signal 514 is a predetermined level corresponding to a nominal energy level of the drive signal 503 The high voltage level of the energy control signal 504 forces an increase in the duty cycle of the drive signal 503, thereby increasing the energy level of the drive signal 503. In the preferred embodiment, the energy level of the drive signal 503 is nominally 100 milliwatts but is increased to 30 watts in response to a high voltage level of the energy control signal 514.

The frequency control signal 516 can advantageously provide substantially real-time information, on a pulse-to-pulse basis, concerning the liquid characteristics, including but not limited to viscosity, liquid pressure, over pressure situations (such as may be encountered with clogged fuel injectors), liquid flow rate, and thus fuel economy. By providing this signal as an external telemetry output signal 109*a*, components outside the UVM electronics 108, such as computerized lookup tables and meters, can take advantage of such key parametric information.

An alternative preferred method of controlling an ultrasonic transducer is described in the context of a diesel fuel injection system 100 as illustrated in FIGS. 1 and 6. Each of the ultrasonic transducers 107*a–d* in the diesel engine fuel system of FIG. 1 is controlled by the UVM electronics 108 as described herein and illustrated in FIG. 6. Generally described, ultrasonic energy is provided to each of the transducers 107*a–d* by the UVM electronics 108. While providing ultrasonic energy to the transducer 107*a*, conditions may cause the resonant characteristics of the transducer 107*a* to shift. The resonant shift is detected by the UVM electronics 108 as a phase difference between the voltage and current of the drive signal 503. In response to the phase difference, the UVM electronics 108 adjusts the frequency and energy level of the drive signal 503 until the phase difference is substantially eliminated. Specifically, the energy level of the drive signal 503 is increased to a second energy level when the value of the energy control signal 514 exceeds a first predetermined value corresponding to the low power mode. In this manner, the UVM electronics 108 can control the transducer and ensure maximum energy is absorbed by the liquid, such as diesel fuel, thereby changing the liquid's viscosity.

In the preferred embodiment, when the injector pump 104 is not addressing a specific ultrasonic injector 106*a* the energy level of the drive signal 503 driving the corresponding transducer 107*a*, is in a low power mode, typically 100 milliwatts. Additionally, the detected phase difference is typically less than 20 degrees and the frequency control voltage is typically less than 2.6 volts while in this low power mode. At the inception of a fuel injection stroke by the injector pump 104, the rapidly increasing liquid pressure causes an abrupt change in detected phase difference, typically 40 degrees, between the voltage and current of the drive signal 503. This detected phase difference forces the frequency control signal 516 above the voltage level of the Vref1 622 and turns on the transmission gate 624. When the transmission gate 624 is on, the voltage on the error input 631 of the differential error amplifier 632 is increased. When the voltage on the error input 631 exceeds Vref2 634, the voltage level of the energy control signal 514 is increased by the differential error amplifier 632. The increased voltage level of the energy control signal 514 forces the pulse width comparator 604 to increase the duty cycle of the drive signal 503. Thus, the energy level of the drive signal 503 is increased to a second energy level (high power mode on the very next pulse after detecting the phase difference. Preferably, the second energy level of the drive signal 503 is 30 watts. Those skilled in the art will appreciate that by preferably selecting the voltage level of Vref1 622 to correspond to a threshold phase difference, the energy level of the drive signal is maintained at the second level until the detected phase difference drops below the threshold phase difference. Therefore, by selecting the voltage level of Vref1 622, the value of the detected phase difference when the phase difference is considered "substantially eliminated" can be preferably selected.

The frequency of the drive signal 503 is also adjusted due to the above-mentioned phase difference. The voltage level of the frequency control signal 516 controls the oscillation frequency of the VCO 602. The oscillation frequency of the VCO 602 acts as a clock for the pulse width comparator 604 and adjusts the frequency of the drive signal 503.

The low power mode returns when pressure on the liquid begins to subside. In the context of the diesel fuel injector system 100 illustrated in FIG. 1, the low power mode returns after 400 to 3000 microseconds (the injector pump 104 spray cycle time). The process of adjusting the energy level and the frequency of the drive signal 503 preferably occurs for each of the other ultrasonic injectors 106*b–d* as they are addressed by fuel. In this manner, the UVM electronics 108 driving the transducers 107*a–d* is slaved to the injection pump 104 and it is unnecessary for the UVM electronics 108 to sense engine speed, timing, or throttle position. At the same time, the UVM electronics 108 can preferably provide telemetry signal 109*a* as a pulse-to-pulse indication of viscosity information about the liquid. (e.g., diesel fuel). Although not shown in the preferred embodiment, it is contemplated that other signals (e.g., the sensed voltage signal 510, the sensed current signal 512, and the energy control signal 514) may be made accessible to provide pulse-to-pulse indications of information about the liquid.

As described above, the UVM electronics 108 can control the transducer 107*a* and thereby control the viscosity of a liquid in contact with the transducer 107*a*. The UVM electronics 108 can also control the flow rate of a liquid effected by a transducer 107*a*having a movable element, such as a magnetostrictive transducer 250 (FIG. 4). In general, the movable element 414 is positioned to provide a first flow rate of liquid effected by the transducer 107*a* within the injector 106*a*. By applying ultrasonic energy to the movable element 414, the rheological properties (e.g., viscosity) of the liquid changes, thereby adjusting the flow rate of the liquid. When the energy level and frequency of the ultrasonic energy applied to the movable element 414 are adjusted, the viscosity of the liquid changes, thereby adjusting the flow rate of the liquid.

In more particular detail, the preferred method for controlling the flow rate of a liquid using an ultrasonic transducer is described in the context of the magnetostrictive transducer 250, as the transducer 207*a* of FIG. 1, and the preferred components of the UVM electronics 108 as illustrated in FIGS. 4 and 6. Referring now to FIGS. 4 and 6, the movable element 414 of the transducer 250 is positioned within the bore 404. A dc bias signal 518 from the bias circuit 508 is applied to the excitation drive input 260 of the transducer 250 in order to position the movable element 414. The level of the dc bias signal 518 is adjusted to selectively position the movable element 414 proximately near the exit orifice 406 of the injector 106*a*. At a first level of the dc bias signal 518, the movable element 414 occupies a first position while in contact with the liquid and a first flow rate is established. By changing the level of the dc bias signal 518 to a second level, the movable element 414 is moved to a second position, thereby changing the first flow rate.

The flow rate of liquid effected by the transducer 250 may also be adjusted by applying an alternating current (ac) drive signal 503 to the excitation drive input 260 of the transducer 250. The frequency and energy level of the drive signal 503, as described above, directly influence the viscosity of the liquid. Thus, when the drive signal 503 is applied to the transducer 250, the flow rate of the liquid is adjusted to a second flow rate. Furthermore, when a phase difference between the voltage and current of the drive signal 503 is detected, the frequency of the drive signal is adjusted and the energy level of the drive signal 503 is increased. As a result of changing the frequency and the energy level of the drive signal 503, the flow rate of the liquid is adjusted to a third flow rate. In the context of the diesel fuel injection system 100 (FIG. 1), the ability to control the flow of fuel through the injector 106*a* helps to reduce diesel engine cold start and warm-up pollution.

Figure 7:
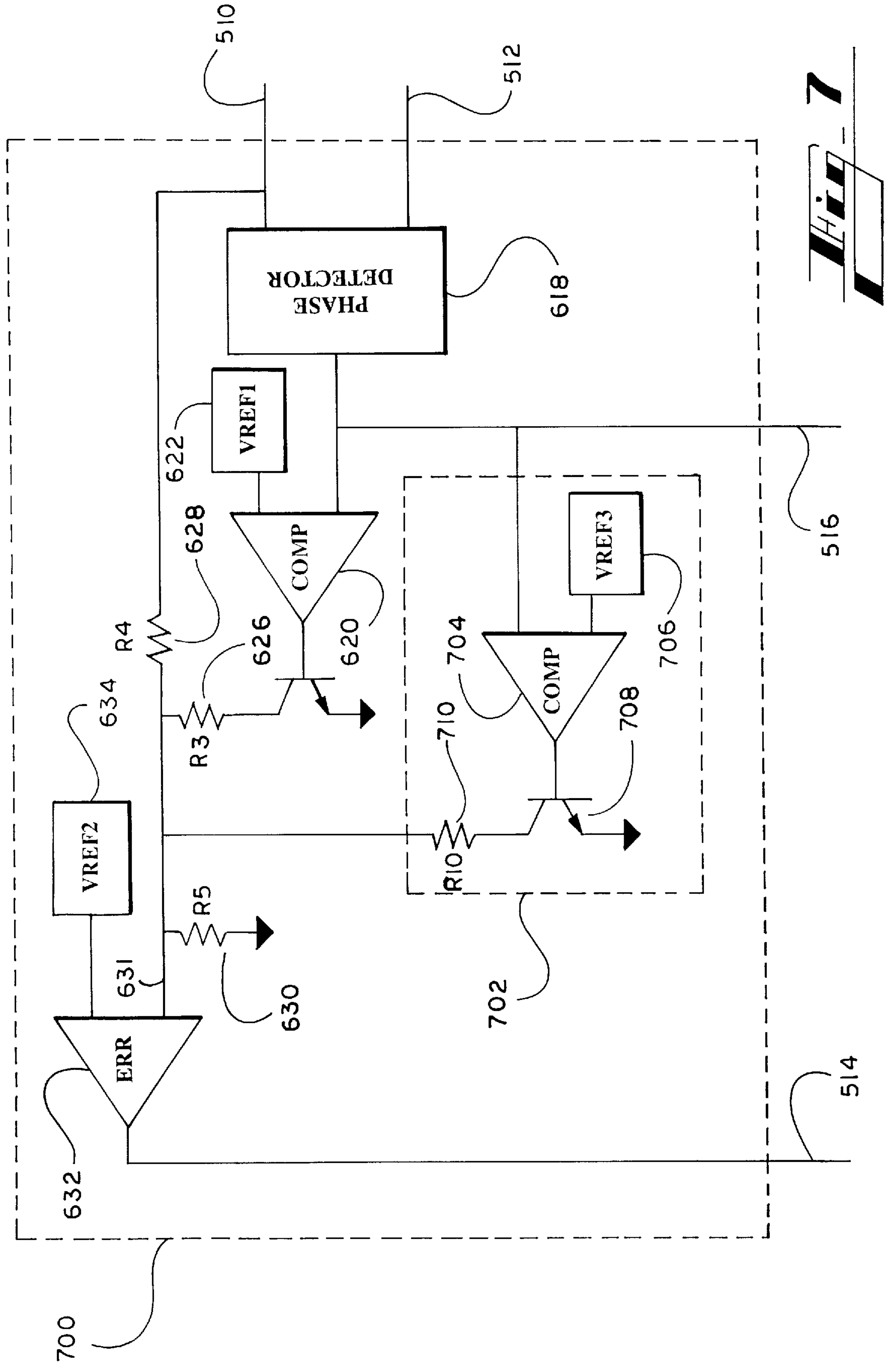
FIG. 7 is a schematic/block diagram of an alternative preferred embodiment of the present invention including additional circuitry for sensing and clearing a clogged injector.

FIG. 7 illustrates an alternative preferred embodiment of the modulator circuit 506 with additional circuitry for further increasing the energy level of the drive signal 503. In the context of the diesel fuel injection system 100 (FIG. 1), the additional circuitry is useful for sensing and clearing a clogged injector. By adding several elements to the modulator circuit 506, as described in connection with FIG. 6, a clogged injector can be detected and additional energy can be provided to the transducer to help clear the clogged injector.

Referring now to FIG. 7, a modified modulator circuit 700 includes a phase detector 618, a first voltage reference (Vref1) 622, a comparator 620, a transmission gate or transistor 624, a resistive divider network of R3 626, R4 628, and R5 630, a differential error amplifier 632, and Vref2 634, as described in connection with FIG. 6. The modified modulator circuit 700 also includes an additional comparator circuit 702. This additional comparator circuit 702 has an additional comparator 704 with one of its inputs connected to the frequency control signal 516. The other input to the additional comparator 704 is connected to a third voltage reference (Vref3) 706. An additional transmission gate 708 is connected to an output of the additional comparator 704. The additional transmission gate 708 is connected between ground and one end of R6 710. The other end of R6 710 is connected to the error input 631 of the differential error amplifier 632.

The output of the additional comparator 704 is nominally at a low voltage level, preferably 0.5 volts. However, when the level of the frequency control signal 516 exceeds Vref3 706, the phase difference is large enough to indicate a liquid over pressure situation, such as a clogged injector. When the level of the frequency control signal 516 exceeds Vref3 706, the output of the additional comparator 704 changes from a low to a high voltage level, preferably greater than 0.7 volts. It is important to note that Vref3 706 is maintained at a higher voltage level than Vref1 622. Therefore, when the additional comparator 704 changes to a high voltage level, the first comparator 620 has already changed to a high voltage level.

Once the output of the additional comparator 704 is at the high voltage level, the additional transmission gate 708 turns on and current flows through R6 710. The current flow through R6 710 increases the voltage level at the error input 631 of the differential error amplifier 632. Thus, the voltage level of the energy control signal 514 is increased to a maximum level. This maximum level is greater than the voltage level of the energy control signal 514 in the high power mode situation (where the frequency control signal 516 exceeds Vref1 622 but does not exceed Vref3 706).

At the maximum power mode, the voltage level of the energy control signal 514 forces the pulse width comparator 604 to use an increased duty cycle when compared to the high power mode. Specifically, the energy level of the drive signal 503 is increased to a third energy level when the value of the energy control signal 514 exceeds the second predetermined value corresponding to the high power mode. In the preferred (embodiment, the energy level of the drive signal 503 is typically increased in such a situation to a third energy level of 70 watts, as opposed to the second energy level of 30 watts delivered in the high power mode.

In summary, when the magnitude of the detected phase difference is large enough, a clogged injector situation is indicated. In response to the large detected phase difference, the additional comparator 704, Vref3 706, the additional transmission gate 708, and R6 710 operate to increase the energy level of the drive signal 503 from a second energy level (high power mode) to a third energy level. The third energy level is greater than the second energy level. Maintaining the energy level of the drive signal at the third energy level assists in clearing the injector 106*a*.

En view of the foregoing description of the preferred embodiment, it will be appreciated that the present invention overcomes the drawbacks of prior solutions of the problems presented to the inventors and meets the objects of the invention as described above. Alternative embodiments will become apparent to those skilled in the art to which the present invention pertains without departing from its spirit and scope. Accordingly, the scope of the present invention is defined by the appended claims rather than the foregoing description.

We claim:

1. An apparatus for controlling an ultrasonic transducer, comprising:

a signal generator for providing a pulsed drive signal to drive said ultrasonic transducer, said pulsed drive signal having a frequency level and an energy level;

a feedback means for providing a modulation control signal to said signal generator, the value of said modulation control signal corresponding to a phase difference between the voltage level of said used drive signal and the current level of said pulsed drive signal;

said signal generator being operative to adjust said frequency level of said pulsed drive signal in response to said value of said modulation control signal; and said signal generator being further operative to adjust said energy level of said pulsed drive signal in response to said value of said modulation control signal without changing said frequency level of said pulsed drive signal, so as to substantially eliminate said phase difference, wherein said modulation control signal is further operative to provide a substantially real-time indication of the viscosity of a liquid when said liquid is in contact with said ultrasonic transducer.

2. An apparatus for controlling an ultrasonic transducer, comprising:

a signal generator for providing a pulsed drive signal to drive said ultrasonic transducer;

a signal sensing means for providing a voltage sense signal in response to the voltage level of said pulsed drive signal and for providing a current sense signal in response to the current level of said pulsed drive signal;

a modulator for providing a frequency control signal and an energy control signal to said signal generator, the value of said frequency control signal and the value of said energy control signal corresponding to a phase difference between said voltage sense signal and said current sense signal;

said signal generator being operative to adjust the frequency of said pulsed drive signal in response to the voltage level of said frequency control signal; and said signal generator being operative to adjust the energy level of said pulsed drive signal in response to the voltage level of said energy control signal without changing the frequency of said drive signal, whereby said phase difference is substantially eliminated, wherein said frequency control signal is further operative to provide a substantially real-time indication of the viscosity of a liquid when said liquid is in contact with said ultrasonic transducer.

3. A method of controlling an ultrasonic transducer, comprising the steps of:

providing a pulsed drive signal to drive said ultrasonic transducer, said pulsed drive signal having a voltage level and a current level;

providing a modulation control signal, the value of said modulation control signal corresponding to a phase difference between said voltage level of said pulsed drive signal and said current level of said pulsed drive signal;

in response to a change in said value of said modulation control signal, changing said pulsed drive signal by adjusting the frequency of said pulsed drive signal; and in response to said change in said value of said modulation control signal, changing said pulsed drive signal by adjusting the energy level of said pulsed drive signal without changing the frequency of said pulsed drive signal, so as to substantially eliminate said phase difference, wherein said modulation control signal is further operative to provide a substantially real-time indication of the viscosity of a liquid when said liquid is in contact with said ultrasonic transducer.

* * * * *